(12) United States Patent
McDaniel et al.

(10) Patent No.: US 8,674,404 B2
(45) Date of Patent: Mar. 18, 2014

(54) ADDITIONAL METAL ROUTING IN SEMICONDUCTOR DEVICES

(75) Inventors: Terry McDaniel, Boise, ID (US); James Green, Nampa, ID (US); Mark Fischer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/972,232

(22) Filed: Dec. 17, 2010

(65) Prior Publication Data

US 2011/0086470 A1  Apr. 14, 2011

Related U.S. Application Data

(62) Division of application No. 11/331,951, filed on Jan. 13, 2006, now Pat. No. 7,859,112.

(51) Int. Cl.
*H01L 29/66* (2006.01)

(52) U.S. Cl.
USPC .......................................... 257/142

(58) Field of Classification Search
USPC .......... 257/211, 758, E23.141, E23.151, 142, 257/197; 438/239, 241, 622, 633, 648
See application file for complete search history.

(56) References Cited

U.S. PATENT DOCUMENTS

| | | | |
|---|---|---|---|
| 5,798,551 A | | 8/1998 | Kikushima et al. |
| 5,893,734 A | * | 4/1999 | Jeng et al. ............ 438/239 |
| 5,933,725 A | * | 8/1999 | Kirsch et al. ............ 438/239 |
| 6,107,189 A | | 8/2000 | Wald |
| 6,281,059 B1 | | 8/2001 | Cheng et al. |
| 6,326,270 B1 | * | 12/2001 | Lee et al. ............ 438/279 |
| 6,518,153 B1 | | 2/2003 | Lin et al. |
| 6,551,878 B2 | | 4/2003 | Clampitt et al. |
| 6,569,758 B2 | | 5/2003 | Jorger et al. |
| 6,649,510 B2 | | 11/2003 | Lee |

(Continued)

FOREIGN PATENT DOCUMENTS

| | | |
|---|---|---|
| EP | 1 148 545 | 10/2001 |
| GB | 2371146 | 7/2002 |

(Continued)

OTHER PUBLICATIONS

Partial International Search Report for corresponding PCT/US2007/000410, filed May 1, 2007.

(Continued)

*Primary Examiner* — Jae Lee
(74) *Attorney, Agent, or Firm* — Knobbe, Martens, Olson & Bear, LLP

(57) ABSTRACT

Memory devices, such as DRAM memory devices, may include one or more metal layers above a local interconnect of the DRAM memory that make contact to lower gate regions of the memory device. As the size of semiconductor components decreases and circuit densities increase, the density of the metal routing in these upper metal layers becomes increasingly difficult to fabricate. By providing additional metal routing in the lower gate regions that may be coupled to the upper metal layers, the spacing requirements of the upper metal layers may be eased, while maintaining the size of the semiconductor device. In addition, the additional metal routing formed in the gate regions of the memory devices may be disposed parallel to other metal contacts in a strapping configuration, thus reducing a resistance of the metal contacts, such as buried digit lines of a DRAM memory cell.

11 Claims, 6 Drawing Sheets

FIG. 5

(56) References Cited

U.S. PATENT DOCUMENTS

| | | | |
|---|---|---|---|
| 6,677,650 B2 | 1/2004 | Fischer et al. | |
| 6,693,025 B2 | 2/2004 | Tang et al. | |
| 6,730,581 B2* | 5/2004 | Suguro | 438/486 |
| 6,784,472 B2* | 8/2004 | Iriyama et al. | 257/288 |
| 6,784,503 B2 | 8/2004 | Shimizu et al. | |
| 6,797,600 B2 | 9/2004 | Manning | |
| 7,056,794 B2* | 6/2006 | Ku et al. | 438/287 |
| 7,355,880 B1* | 4/2008 | Jin et al. | 365/154 |
| 7,859,112 B2 | 12/2010 | McDaniel et al. | |
| 2002/0017692 A1* | 2/2002 | Shimizu et al. | 257/390 |
| 2003/0064562 A1 | 4/2003 | Kim et al. | |
| 2003/0119292 A1* | 6/2003 | Lee et al. | 438/596 |
| 2003/0183822 A1 | 10/2003 | Lane et al. | |
| 2003/0216038 A1* | 11/2003 | Madhukar et al. | 438/648 |
| 2004/0171247 A1* | 9/2004 | Cho et al. | 438/622 |
| 2005/0224886 A1* | 10/2005 | Doyle et al. | 257/368 |
| 2006/0065939 A1* | 3/2006 | Doczy et al. | 257/412 |
| 2007/0037343 A1* | 2/2007 | Colombo et al. | 438/231 |
| 2007/0262451 A1* | 11/2007 | Rachmady et al. | 257/758 |
| 2011/0147858 A1* | 6/2011 | Lim et al. | 257/412 |
| 2011/0248359 A1* | 10/2011 | Hwang et al. | 257/410 |

FOREIGN PATENT DOCUMENTS

| | | |
|---|---|---|
| JP | 11-026757 | 1/1999 |
| KR | 10-0291009 | 8/2001 |
| KR | 2002-0018610 | 3/2002 |
| TW | 329548 | 4/1998 |
| WO | WO 9635234 | 11/1996 |

OTHER PUBLICATIONS

Translation of Office Action for corresponding ROC Pat Appl. No. 096101315 dated Apr. 19, 2010.

Office Action dated Apr. 20, 2012 for corresponding JP Application No. 2008-550356.

Search Report/Written Opinion dated Jun. 6, 2013 for corresponding EP Application 07 709 601.4-1552.

Office Action dated Sep. 16, 2013 for corresponding KR Application No. 10-2008-7019809.

* cited by examiner

ADDITIONAL METAL ROUTING IN SEMICONDUCTOR DEVICES

CROSS-REFERENCE TO RELATED APPLICATIONS

This application is a divisional of U.S. patent application Ser. No. 11/331,951 filed Jan. 13, 2006 which is hereby incorporated by reference in its entirety herein.

BACKGROUND OF THE INVENTION

1. Field of the Invention

This invention relates to a method of fabrication of semiconductor devices, and more particularly, to a method of providing extra metal routing in a gate portion of semiconductor devices.

2. Description of the Related Art

Combining both embedded DRAM memory and other components, such as high speed logic circuits, onto a single chip is often useful. In many embodiments, the DRAM memory components are fabricated in a central array portion of a semiconductor device while the logic circuits are fabricated in periphery portions of the semiconductor device. In some embodiments, faster speed is achieved, and bandwidth and capacitance problems are reduced when incorporating both memory and logic components on a single memory device, or chip.

In a typical memory device having both memory (array components) and logic (periphery components), the memory device often includes one or more local interconnects formed above the memory or logic components. The local interconnect may include metal routing between components of the memory device, either in the array or the periphery. Above the local interconnects, additional layers containing additional circuitry, such as logic components, memory contacts, or metal routing, may be formed. In some embodiments, a metal layer above the local interconnects comprises many of the metal routings used by the memory device.

As the density of components on a single memory device increases, the metal routing in the metal layer of the memory device also becomes increasingly dense and difficult to fabricate. Accordingly, there is an increasing need for systems and methods of incorporating additional routing in a memory device without increasing the size of the memory device.

SUMMARY OF THE INVENTION

In one embodiment, a method of forming additional metal routing in a semiconductor device comprising a memory array and a peripheral array comprises the steps of forming a plurality of transistors in at least one of the memory array and the peripheral array, wherein nitride caps are formed above each of the transistors, etching a portion of selected nitride caps, and depositing a metal film in the etched-away portions of the selected nitride caps in order to form additional metal routing.

In another embodiment, a semiconductor device comprises one or more gate structures each having a nitride cap, a metallization layer comprising metal routing, additional metal routing embedded in a selected group of the nitride caps, wherein the selected group of nitride caps are each partially etched in order to form a cavity in which a metal is deposited in order to form the extra metal routing, and one or more contacts between the metal routing in the metallization layer and the additional metal routing embedded in the nitride caps.

In another embodiment, a semiconductor device comprises a semiconductor substrate having an upper surface, a plurality of electronic devices formed on the semiconductor substrate, the plurality of electronic devices including at least a plurality of transistors, wherein the plurality of transistors includes a gate stack extending above the upper surface of the substrate, a gate conductor that interconnects the gates stacks of the plurality of transistors, wherein the gate conductor is surrounded by a protective isolation structure, a global insulative layer overlying the substrate, the plurality of electronic devices, and the gate conductor, at least one conductor layer having a plurality of conductive elements formed therein to interconnect selected ones of the plurality of electronic devices, wherein the conductive layer is formed in the global insulative layer so as to be positioned above the plurality of electronic devices, and a plurality of supplemental conductive elements formed in the protective isolation structure of the gate conductors, wherein the plurality of supplemental conductive elements are selectively coupled to the plurality of conductive elements in order to provide additional interconnection between the plurality of electronic devices without increasing a density of the conductive elements in the at least one conductor layer.

DETAILED DESCRIPTION OF THE PREFERRED EMBODIMENT

Embodiments of the invention will now be described with reference to the accompanying Figures, wherein like numerals refer to like elements throughout. The terminology used in the description presented herein is not intended to be interpreted in any limited or restrictive manner, simply because it is being utilized in conjunction with a detailed description of certain specific embodiments of the invention. Furthermore, embodiments of the invention may include several novel features, no single one of which is solely responsible for its desirable attributes or which is essential to practicing the inventions herein described.

As discussed above, semiconductor memory devices, such as DRAM memory devices, for example, may include one or more metal layers above a local interconnect of the DRAM memory that make contact to lower gate regions of the memory device through vias in one or more insulating layers. However, due to the reduction in size of semiconductor components and increased circuit density, the density of the metal routing in these upper metal layers is becoming increasingly difficult to fabricate. As described in further detail below, by providing extra metal layers in lower memory regions, such as transistor gate regions, that may be coupled to the upper metal layers, the spacing requirements of the metal routing in the upper metal layers may be eased, while maintaining the size of the semiconductor device. In addition, the extra metal routing formed in the gate regions of the memory devices may be disposed parallel to other metal contacts and coupled to either end of the other metal contacts, such as buried digit lines, in order to reduce a resistance of the other metal contacts.

Figure 1:
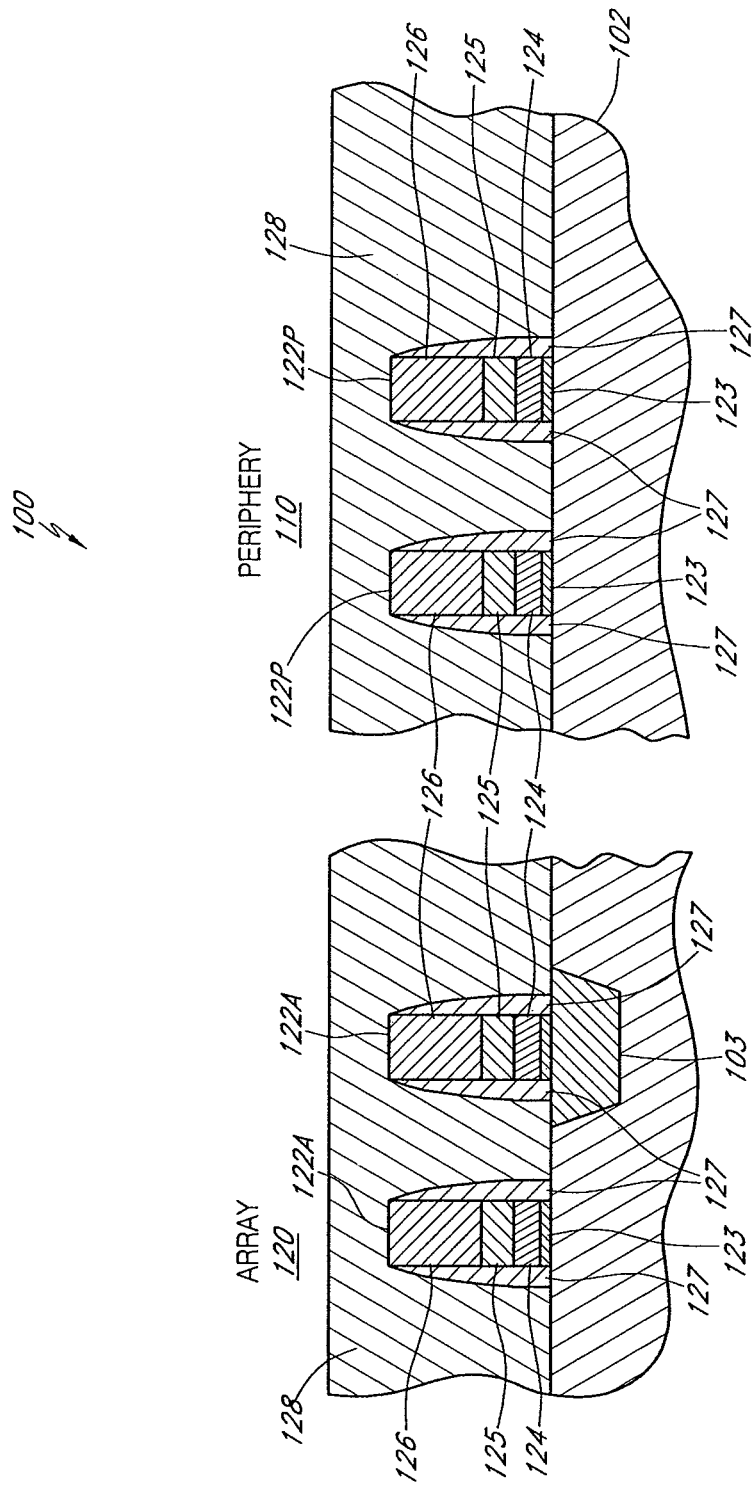
FIG. 1 is a cross-sectional view of a semiconductor device having an array portion and a periphery portion.

FIG. 1 is a cross-sectional view of a semiconductor device 100 having an array portion 120 and a periphery portion 110. In one embodiment, the array portion 120 comprises a plurality of transistors 122A, such as DRAM transistors, and the periphery portion 110 comprises a plurality of transistors 122P, such as DRAM or SRAM transistors, for example. In the embodiment of FIG. 1, the semiconductor device 100 comprises a silicon substrate 102 having isolation areas 103, such as shallow trench isolation (STI) regions.

In one embodiment, each of the transistors 122A, 122P comprises a number of layers that are fabricated in any of a number of well known manners. In the exemplary transistors 122A, 122P, a gate oxide layer 123 comprising silicon dioxide, for example, is formed on the substrate 102. A layer 124 may be formed on the gate oxide layer 123. In one embodiment, the layer 124 comprises a doped polysilicon, which provides a wordline for the array transistors 122A. In exemplary FIG. 1, a layer 125 is formed on the layer 124. In one embodiment, the layer 125 comprises a Tungsten, Tungsten Nitride, or Tungsten Silicide. In the embodiment of FIG. 1, a cap 126 is formed on the layer 125. In one embodiment, the cap 126 comprises a nitride material, such as Silicon Nitride. In the embodiment of FIG. 1, the transistors 122A, 122P are surrounded on their lateral sides by a silicon nitride spacer 127. The exemplary transistors 122A, 122P are overlaid with an insulative layer 128. In one embodiment, the insulative layer 128 comprises borophosphosilicate (BPSG), phosphosilicate glass (PSG), or silicon dioxide.

As illustrated in FIG. 1, the insulative layer 128 covers the previously exposed sides and top surfaces of the transistors 122. As described further below, in an advantageous embodiment, portions of the insulative layer 128 are removed, followed by etching away of portions of selected nitride caps 126, and finally depositing a metal in the etched-away portions in the nitride caps 126 in order to form extra metal routing. In certain embodiments, the extra metal routing formed above the nitride caps 126 may be parallel to digit lines of a memory device.

Figure 2:
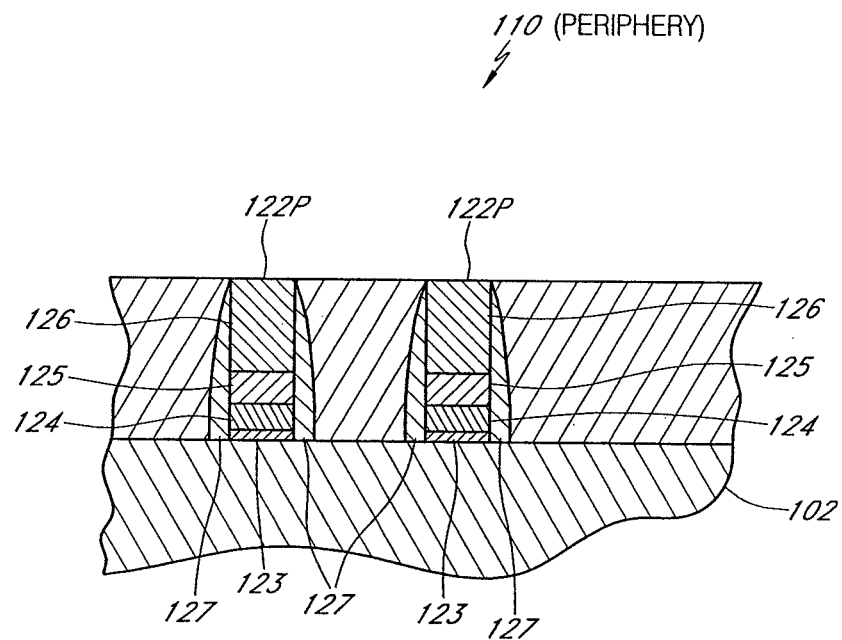
FIG. 2 is a cross-sectional view of the periphery portion of the semiconductor device illustrated in FIG. 1.

FIG. 2 is a cross-sectional view of the periphery portion 110 of the semiconductor device 100 illustrated in FIG. 1. As illustrated in FIG. 2, a top surface of the insulative layer 128 has been removed so that top surfaces of the transistors 122P are exposed. In one embodiment, a post chemical-mechanical polishing (PCMP) process is performed in order to remove an upper portion of the insulative layer 128.

Figure 3:
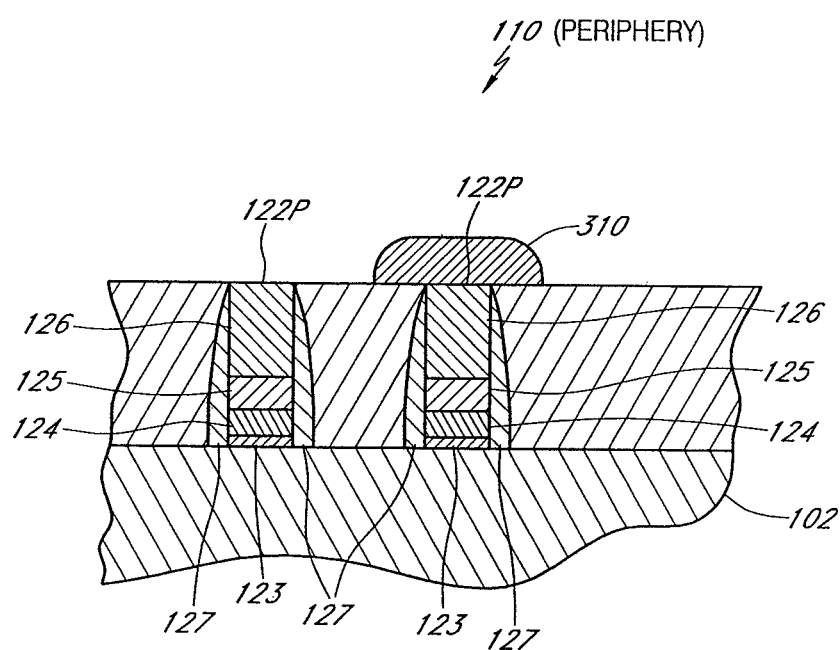
FIG. 3 is a cross-sectional view of the periphery portion of the semiconductor device illustrated in FIG. 2 at a subsequent processing stage.

FIG. 3 is a cross-sectional view of the periphery portion 110 of the semiconductor device 100 illustrated in FIG. 2 at a subsequent processing stage. In the illustration of FIG. 3, a photoresist material 310 has been placed over one of the transistors 122P. In order to form the extra metal routing only in the areas desired, a photoresist material 310 may be placed over the portions of the semiconductor device 100, such as selected transistors 122P, that are not to be further etched.

Figure 4:
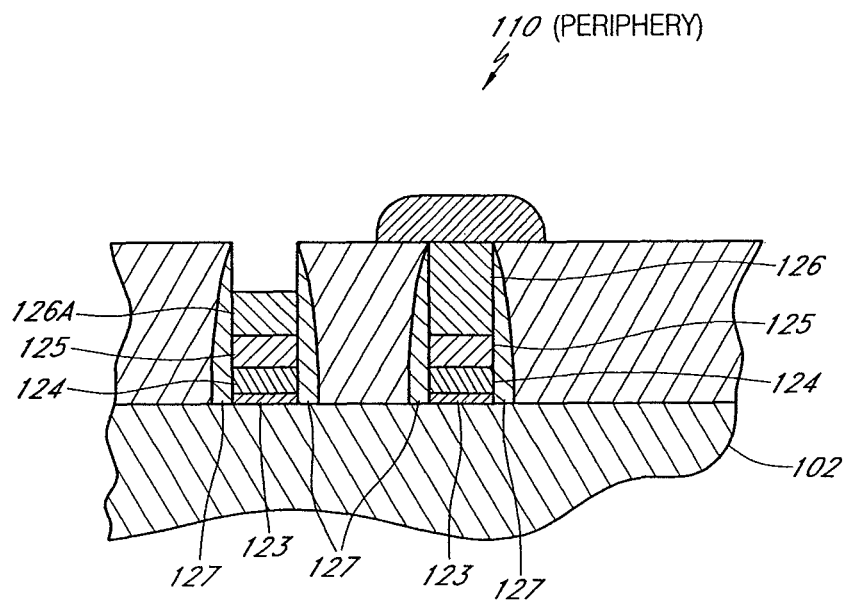
FIG. 4 is a cross-sectional view of the periphery portion of the semiconductor device illustrated in FIG. 3 at a subsequent processing stage.

FIG. 4 is a cross-sectional view of the periphery portion 110 of the semiconductor device 100 illustrated in FIG. 3 at a subsequent processing stage. As illustrated in FIG. 4, a top portion of the nitride cap 126A has been removed, such as by a selective etching process. In one embodiment the nitride cap 126A is in the range of about 1,000-1,500 Angstroms thick. In another embodiment, the nitride cap 126A is about 1,500 Angstroms thick. In one embodiment, a nitride etch selective to oxide is performed on the periphery 110 in order to remove a portion of the nitride cap 126A. In one embodiment, about 100-1000 Angstroms of the nitride cap 126A is etched back. In one embodiment, about 500 Angstroms of the nitride cap 126A is etched back.

Figure 5:
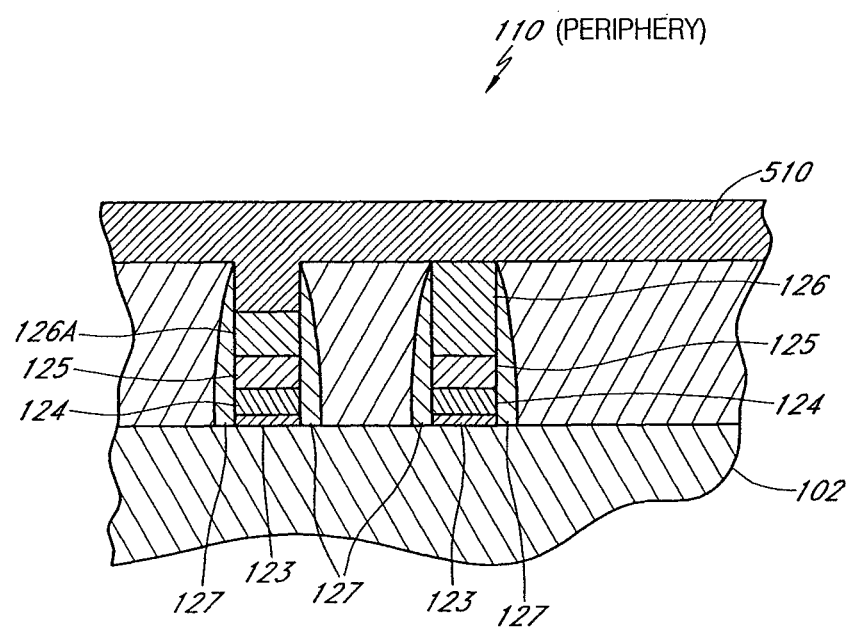
FIG. 5 is a cross-sectional view of the periphery portion of the semiconductor device illustrated in FIG. 4 at a subsequent processing stage.

FIG. 5 is a cross-sectional view of the periphery portion 110 of the semiconductor device 100 illustrated in FIG. 4 at a subsequent processing stage. As illustrated in FIG. 5, the photoresist 310 has been removed, using any suitable process that is known in the art, and a metal film 510 has been deposited on the exposed surfaces of the periphery 110. In one embodiment, the metal film 510 comprises Tungsten. In other embodiments, the metal film 510 may include other suitable conductive materials.

Figure 6:
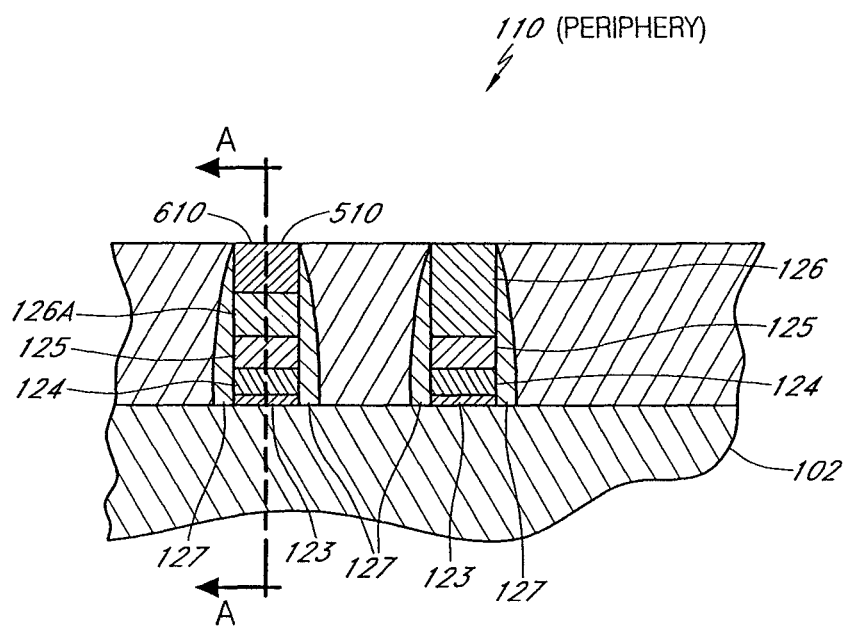
FIG. 6 is a cross-sectional view of the periphery portion of the semiconductor device illustrated in FIG. 5 at a subsequent processing stage.

FIG. 6 is a cross-sectional view of the periphery portion 110 of the semiconductor device 100 illustrated in FIG. 5 at a subsequent processing stage. As illustrated in FIG. 6, the metal layer 510 has been partially removed, such as by etching or CMP, leaving only a metal runner 610 (also referred to herein as "additional metal routing 610") that was formed by the deposition of the metal film in the etched-away portion of the nitride cap 126A. The metal runner 610 may now be used to provide additional metal routing for the semiconductor device. For example, contacts between the additional metal routing and the underlying transistors may be formed in order to electrically couple desired portions of the transistors. Because such routing was previously performed by one or more upper metal layers, the additional metal routing 610 allows the spacing of the upper metal layers to be relaxed.

Figure 7:
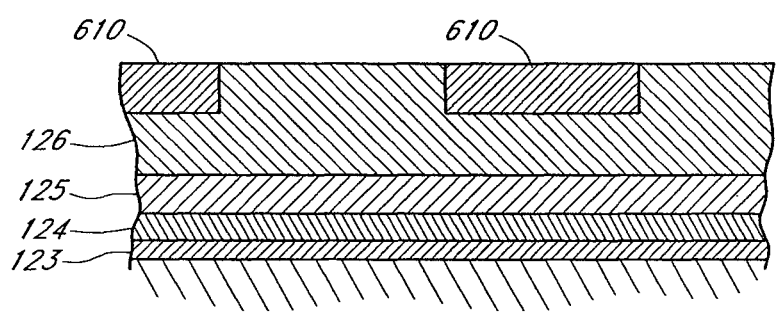
FIG. 7 is a cross-sectional side view of the periphery portion of the semiconductor device taken across section A-A of FIG. 6.

FIG. 7 is a cross sectional side view of the periphery portion 110 of the semiconductor device 100 across section A-A of FIG. 6. As shown in FIG. 7, the metal runner 610 is selectively deposited, as described above with respect to take FIGS. 3-6. Thus, the metal runners 610 may be patterned to connect various portions of the semiconductor device 100.

Figure 8:
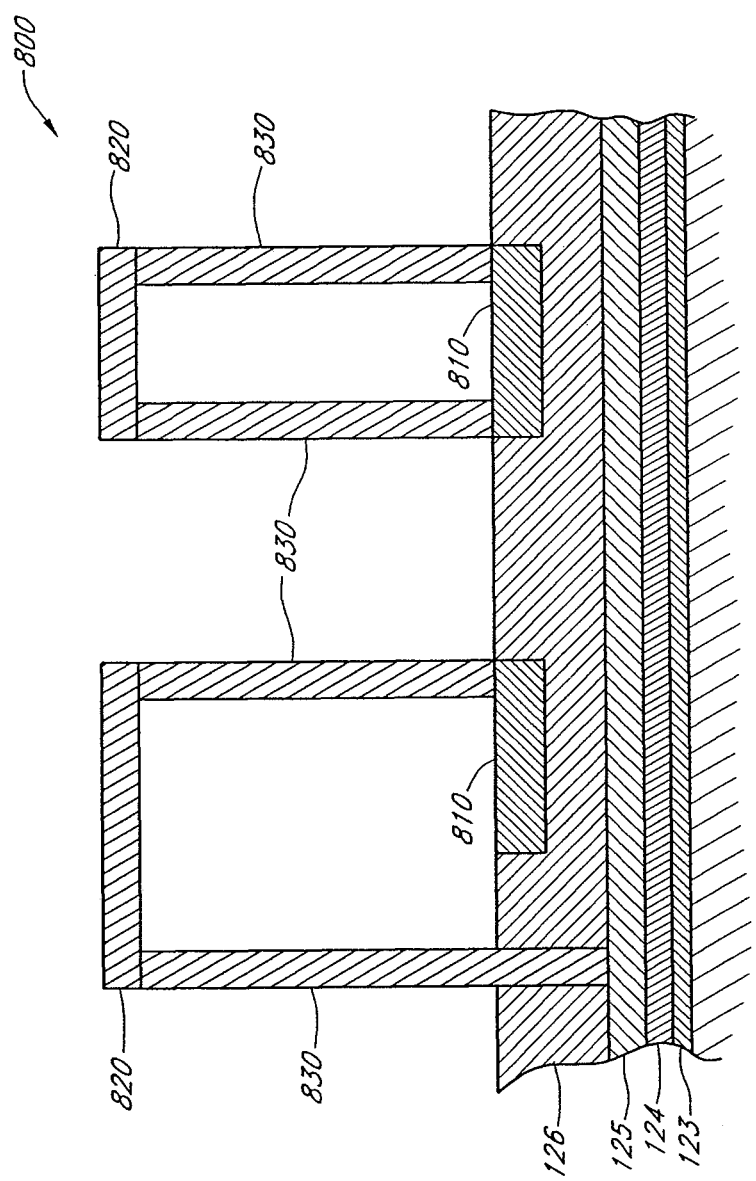
FIG. 8 is a cross-sectional side view of an exemplary periphery portion of a semiconductor device having additional metal runners recessed in nitride caps of transistors.

FIG. 8 is a cross-sectional side view of an exemplary periphery portion 800 of a semiconductor device having additional metal routing 810 recessed in nitride caps of transistors (transistor details are not illustrated in FIG. 8). In the embodiment of FIG. 8, a metallization layer 820 is selectively coupled to metal runners 810 via contacts 830. In prior art embodiments, routing is primarily performed at the metallization layer 820. However, in semiconductor devices having significant routing needs, the metallization layer 820 may become tightly pitched and thus, difficult to fabricate. With the addition of the additional metal routing 810, the metallization layer 820 is able to drop contacts 830 to the metal runner 810 in order to reduce the metal routing at the metallization layer 820. Thus, by patterning the additional metal routing 810 and the contacts 830 appropriately, the peripheral portion 800 may have an improved routing density by dropping a contact down to the metal runners 810, running the metal runner 810 to a desired location, and dropping another contact at the desired location to connect to the metal runner 810, thereby reducing the metal routing in the metallization layer 820.

Figure 9:
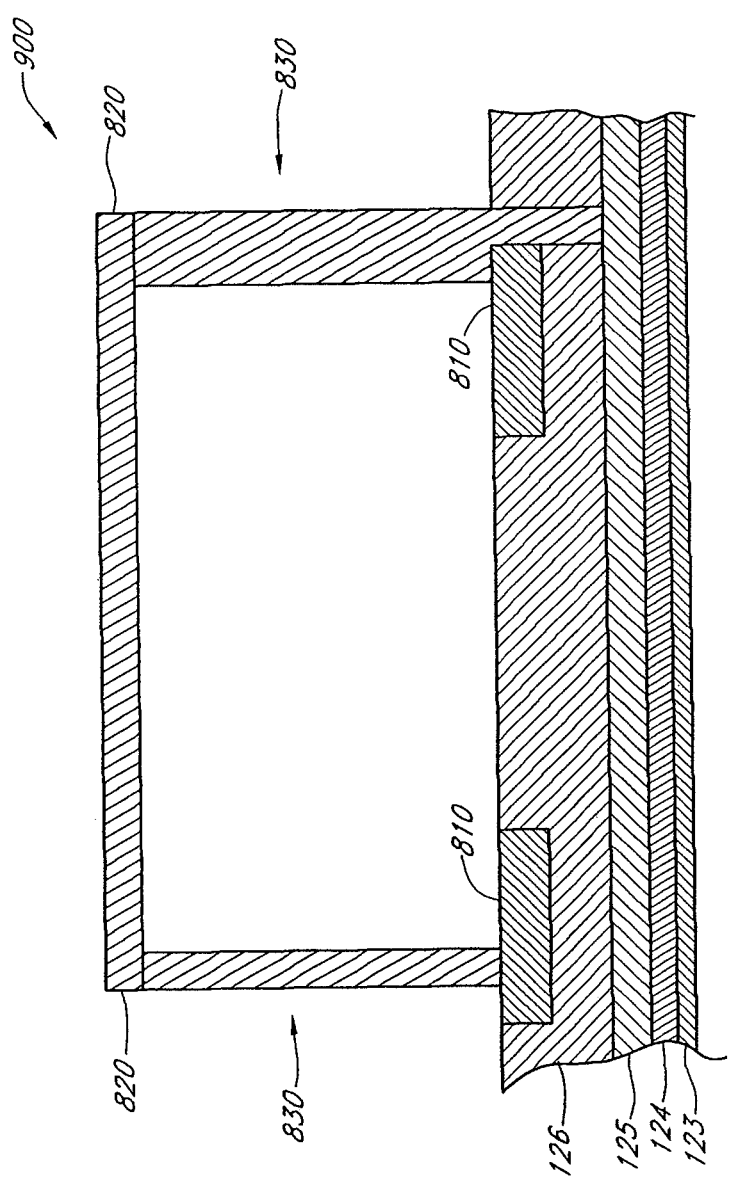
FIG. 9 is a cross-sectional side view of another exemplary periphery portion of a semiconductor device having additional metal runners recessed in nitride caps of transistors.

FIG. 9 is a cross-sectional side view of another exemplary periphery portion 900 of a semiconductor device having additional metal runners 810 recessed in nitride caps of transistors (transistor details are not illustrated in FIG. 8). As those of skill in the art will recognize, high diffusion resistance in semiconductor devices is commonly reduced by placing metal across the diffusion wherever possible. This technique is known as strapping and is often accomplished by connecting a parallel metal path to the primary metal path. In FIG. 9, the contact layer 830 straddles the metal runners 810 so that the additional metal routing 820 is positioned parallel to the layer 125, which may comprise a buried digit line, for example. In this embodiment, the metal runners 810 may be coupled to the layer 125 at two or more locations in order to reduce a resistance of the routing in layer 125.

Although described herein with respect to the periphery portion of a semiconductor device, extra metal routing may also be embedded into nitride caps of transistors in the array portion of semiconductor devices. Thus, additional metal routing may be implemented according to the systems and methods described herein in any portion of a semiconductor device.

The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

What is claimed is:

1. A method of forming additional metal routing in a semiconductor device comprising a memory array and a peripheral array, the method comprising:

forming a plurality of transistors in at least one of the memory array and the peripheral array, wherein nitride caps are formed above each of the transistors;

etching a portion of selected nitride caps so as to define a recesses in each of the selected nitride caps each recess having a width that is substantially equal to the width of the selected nitride cap and the etching resulting in a portion of each selected nitride cap remaining interposed between the recess therein and the corresponding transistor; and depositing a metal film in the etched-away portions of the selected nitride caps in order to form additional metal routing wherein the remaining portions of the selected nitride caps provide insulation from electrical contact between the deposited metal film and the gate structures of the transistors corresponding to the selected nitride caps.

2. The method of claim 1, further comprising masking a portion of the periphery transistors that are not to be etched by the step of etching.

3. The method of claim 1, further comprising forming a metal layer comprising metal routing on the periphery transistors, wherein portions of the metal routing electrically contact the additional metal routing.

4. The method of claim 1, wherein the metal film comprises Tungsten.

5. The method of claim 2, wherein the additional metal routing is parallel to a buried digit line of at least one of the periphery transistors.

6. The method of claim 5, wherein the additional metal routing is electrically coupled to at least two portions of the buried digit line.

7. The method of claim 1, wherein the nitride caps each have a thickness of about 1500 Angstroms.

8. The method of claim 7, wherein the etching recesses the selected nitride caps by about 500 Angstroms.

9. The method of claim 7, wherein the etching recesses the selected nitride caps in the range of about 100 to 1000 Angstroms.

10. The method of claim 2, wherein the additional metal routing is electrically connected to two portions of the metal routing so as to form a jumper between the two portions.

11. The method of claim 1, wherein the semiconductor device comprises a DRAM.

\* \* \* \* \*

UNITED STATES PATENT AND TRADEMARK OFFICE
CERTIFICATE OF CORRECTION

| | |
|---|---|
| PATENT NO. | : 8,674,404 B2 |
| APPLICATION NO. | : 12/972232 |
| DATED | : March 18, 2014 |
| INVENTOR(S) | : Terry McDaniel et al. |

It is certified that error appears in the above-identified patent and that said Letters Patent is hereby corrected as shown below:

In the Claims

In column 6, line 1, in claim 1, delete "define a" and insert -- define --, therefor.

Signed and Sealed this
Twenty-ninth Day of July, 2014

Michelle K. Lee
*Deputy Director of the United States Patent and Trademark Office*